United States Patent [19]

Moffett

[11] Patent Number: 4,594,656
[45] Date of Patent: Jun. 10, 1986

[54] MEMORY REFRESH APPARATUS

[76] Inventor: Richard C. Moffett, 4116 W. Carol Ave., Phoenix, Ariz. 85021

[21] Appl. No.: 810,537

[22] Filed: Dec. 17, 1985

Related U.S. Application Data

[63] Continuation of Ser. No. 387,732, Jun. 14, 1982, abandoned.

[51] Int. Cl.$^4$ .............................................. G06F 9/00
[52] U.S. Cl. ................................................. 364/200
[58] Field of Search ... 364/200 MS File, 900 MS File; 365/222

[56] References Cited

U.S. PATENT DOCUMENTS

| | | | |
|---|---|---|---|
| 4,000,485 | 12/1976 | Barlow et al. | 364/200 |
| 4,158,883 | 6/1979 | Kadono et al. | 365/222 |
| 4,185,323 | 1/1980 | Johnson et al. | 365/222 |
| 4,249,247 | 2/1981 | Patel | 364/900 |
| 4,317,169 | 2/1982 | Panepinto | 364/200 |
| 4,368,466 | 1/1983 | Dwire | 364/900 |

Primary Examiner—Gareth D. Shaw
Assistant Examiner—Daniel K. Dorsey
Attorney, Agent, or Firm—A. A. Sapelli; J. S. Solakian; A. Medved

[57] ABSTRACT

A memory refresh control scheme is provided wherein the refresh timing and address signals are independent of memory configuration or the configuration of an interface unit. Since the system relates to a distributed memory arrangement, the refresh control signal and the refresh address signals are simultaneously sent to the corresponding address portions of each of the concerned memory sections and to the interface units. The logic involved in generating the refresh signal includes a first counter, driven by the system clock, which periodically generates the refresh request control signal. A second counter generates a digital address for the portion of the memory units to be refreshed. The second counter is incremented by each successive output control signal from the first counter. The digital address generated by the second counter along with the control signal generated by the first counter are simultaneously transmitted to each memory sector and to the interface unit directly associated with those memory sectors. In a distributed system there will be more than one interface unit with its associated memory sectors. Since a feature of the distributed system is the intercommunication between the component parts, it is necessary that the refresh request signal and the refresh address signals be synchronized with respect to the other units.

3 Claims, 3 Drawing Figures

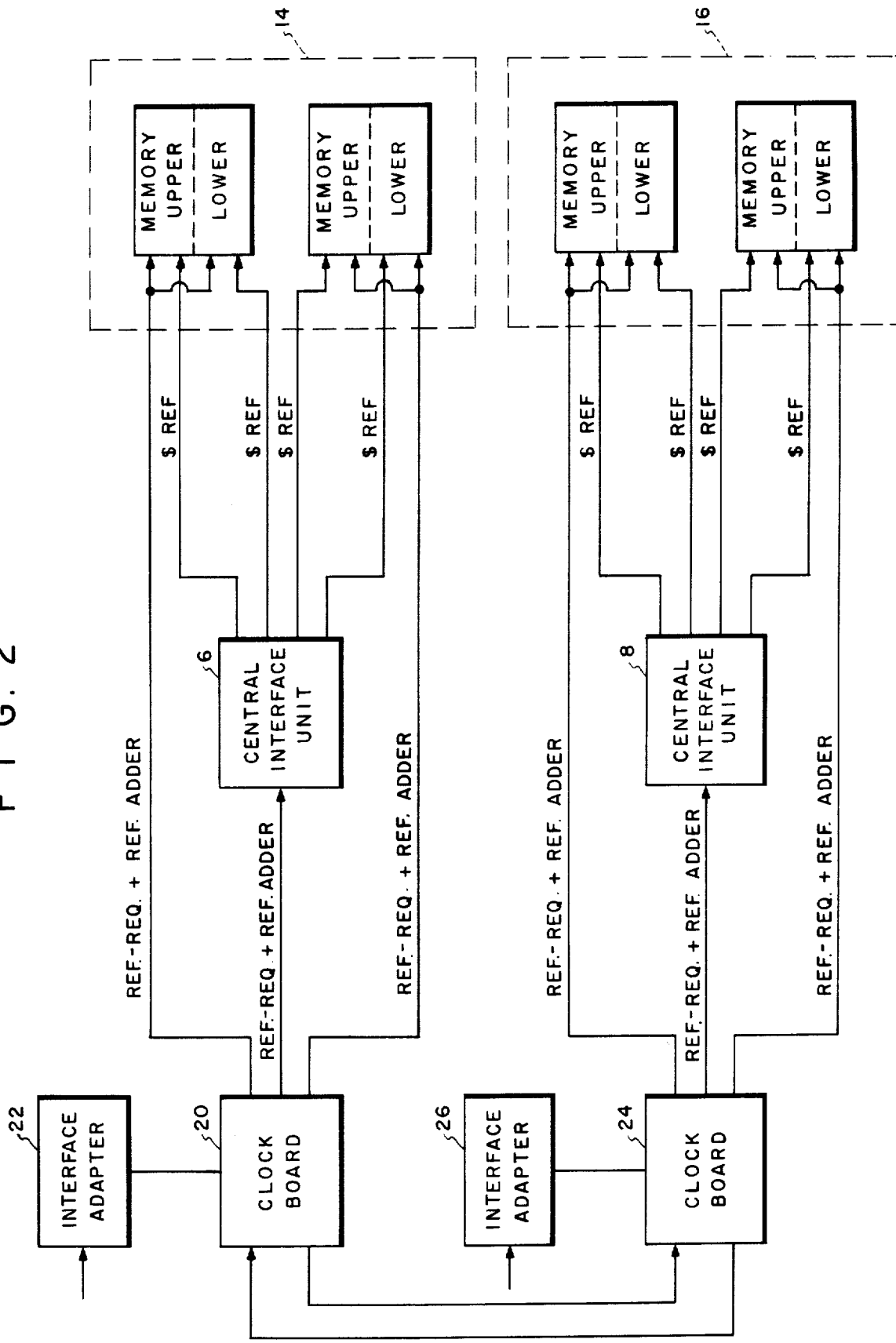

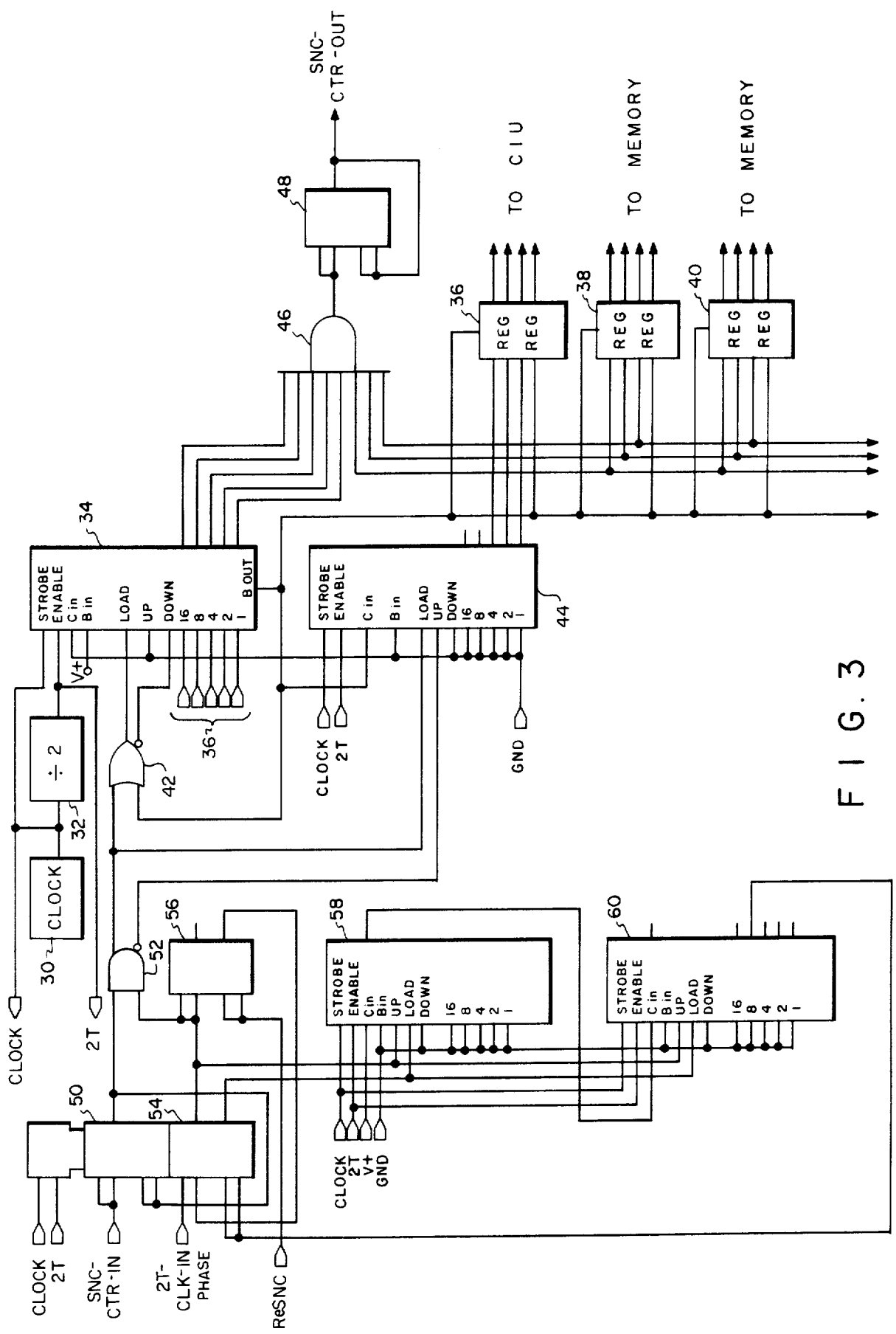

MEMORY REFRESH APPARATUS

This is a continuation of co-pending application Ser. No. 06/387,732, filed on June 14, 1982, now abandoned.

BACKGROUND OF THE INVENTION

The present invention relates to computer apparatus. More particularly, it relates to control means for the refreshment of a volatile memory.

In the field of computer technology, much of the data is stored in volatile memory units wherein the individual bits of information are stored in the memory units as, for example, individual electrical static charges. Such static charges may be maintained for a relatively short time before the charge begins to dissipate. In order to maintain the data in the memory for longer periods of time, it is necessary to provide a memory refresh cycle periodically to restore the level of the charge at the individual memory elements.

Means have been provided in the past for effecting such a refresh cycle in conjunction with computer memory units. For example such a system is shown in U.S. Pat. No. 3,760,379. In accordance with that patent means are provided for refreshing groups of elements of a memory unit in accordance with a procedure which tends to minimize conflict with access to that memory. In accordance with that system, a single memory unit is to be refreshed by the refreshment of individual sub-component parts thereof on a basis of finding a time slot in an available window.

In U.S. Pat. No. 4,317,169 means are provided for effecting the refreshment of a memory in accordance with control logic lodged in the CPU.

In a computer system which is subject to dynamic reconfiguration, however, memory refreshment under the control of the CPU is not fully satisfactory, nor would a refreshment system which is interrelated to the configuration of the CPU, or the memory. Further, in a distributed computer system where a plurality of central processor units may communicate each with its own main memory unit as well as with the memory units associated with other central processor units, it is important that the corresponding components of the several memory units be simultaneously refreshed.

SUMMARY OF THE INVENTION

It is, accordingly, an object of the present invention to provide an improved memory refresh control system.

It is another object of the present invention to provide an improved memory refresh control system as set forth for use with distributed memory characteristics.

It is a further object of the present invention to provide an improved memory refresh control system wherein the operation thereof is independent of the configuration of the memory units or of an associated interface unit.

In accomplishing these and other objects, there has been provided, in accordance with the present invention, a memory refresh control scheme wherein the refresh timing and address signals are independent of memory configuration or the configuration of an interface unit. Since the system relates to a distributed memory arrangement, the refresh control signal and the refresh address signals are simultaneously sent to the corresponding address portions of each of the concerned memory sections and to the interface units. The logic involved in generating the refresh signal includes a first counter, driven by the system clock, which periodically generates the refresh request control signal. A second counter generates a digital address for the portion of the memory units to be refreshed. The second counter is incremented by each successive output control signal from the first counter. The digital address generated by the second counter along with the control signal generated by the first counter are simultaneously transmitted to each memory sector and to the interface unit directly associated with those memory sectors. In a distributed system there will be more than one interface unit with its associated memory sectors. Since a feature of the distributed system is the intercommunication between the component parts, it is necessary that the refresh request signal and the refresh address signals be synchronized with respect to the other units.

BRIEF DESCRIPTION OF THE DRAWINGS

A better understanding of the present invention may be had from the following detailed description when read in the light of the accompanying drawings in which:

FIG. 2 is a schematic logic diagram of a system embodying the present invention; and FIG. 3 is a schematic logic diagram of a circuit embodying the present invention.

DETAILED DESCRIPTION

Figure 1:
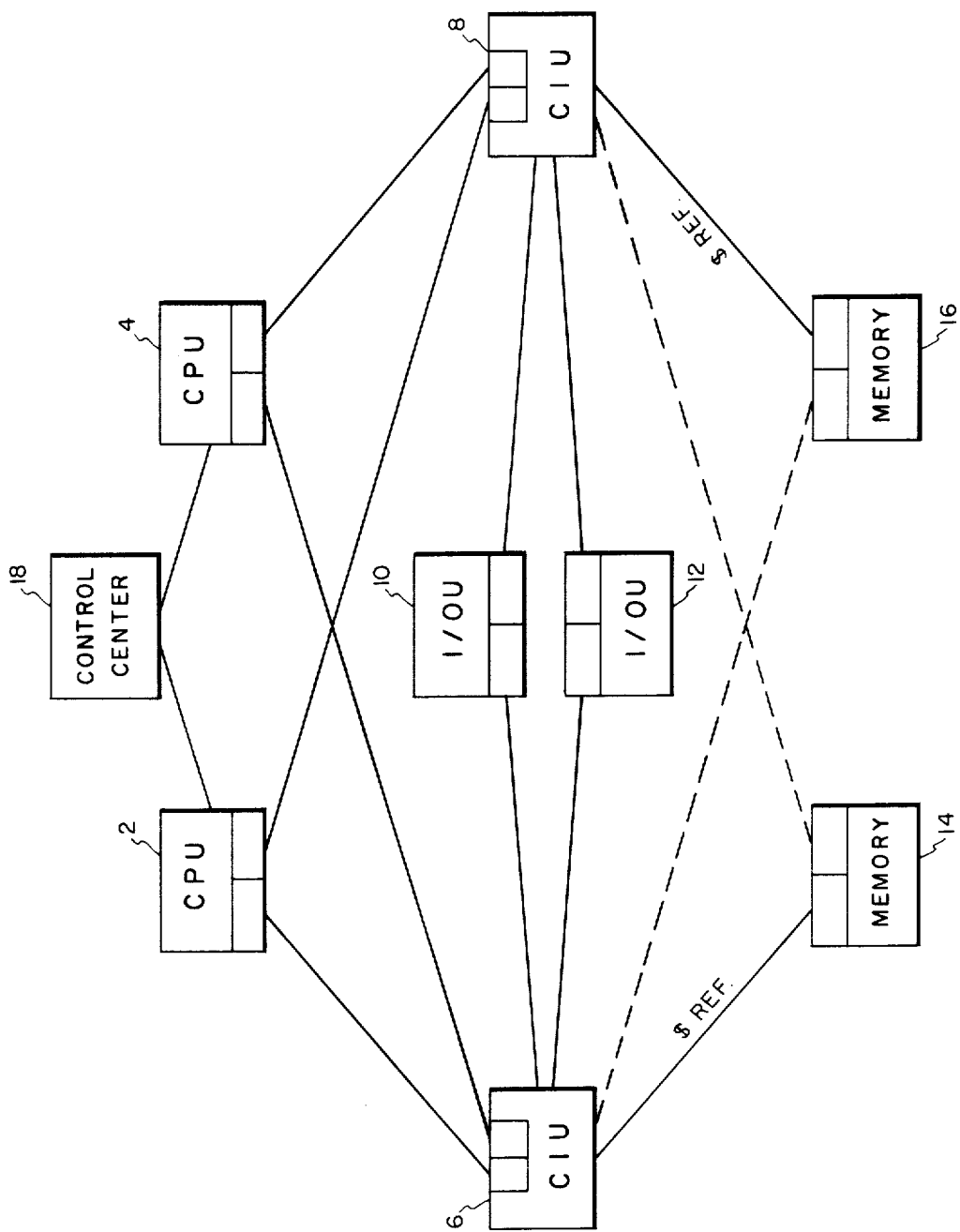
FIG. 1 is a schematic block diagram of a computer system which may embody the present invention.

Referring now to the drawings in more detail, there is shown in FIG. 1, elements of a computer system featuring a distributed operational characteristic. As shown, the system includes a first central processor unit (CPU) 2 and a second central processor unit 4. There is also provided a first central interface unit 6 and a second central interface unit (CIU) 8. The first CPU has means for communicating with both the first CIU 6 and the second CIU 8. Similarly the second CPU 4 has means for communicating with the first CIU 6 and the second CIU 8. One or more input/output units (I/O U) 10 and 12, respectively, are provided. These units basically provide a multiplexed interconnect between the CIUs 6 and 8 and the input/output peripheral units of the system. A first memory unit 14 is connected to be associated with the first CIU 6. Similarly, a second memory unit 16 is connected to be associated with the second CIU 8. In such a system, the central processor units 2 and 4 perform the usual computational manipulation of data. They also perform the basic control functions for the systems. Data is received from or transmitted to the input/output units 10. The central interface units 6, 8 provide, among other things, a traffic management function between the central processor units, the input/output units and the associated memory units.

The memory units 14 and 16 provide a storage place for original data as well as data which has been manipulated by the CPUs. In the system herein set forth, it will be noticed that each of the central interface units 6 and 8 may be in direct communication with either of the two central processor units 2 and 4. Both of the central interface units are in communication with the input/output units 10 and 12. Additionally, in the exemplary embodiment of the present invention, each of the two CIUs has the capability of communicating directly with the memory unit associated with the other half of the system. Thus it may be seen that there is an intercommunication capability between the two halves of the illustrated system. Because of that intercommunication capability, it is necessary that the several components of the system be all synchronized with respect to each other. To this end there is provided a control center 18 for the subject matter of the present invention.

In FIG. 2 there is presented a somewhat more detailed illustration of the interrelationship of the components in accordance with the present invention. More specifically, the central interface unit 6 is illustrated as receiving a control signal from a clock board 20. The clock board 20 includes the system clock for that half of the system connected to the first CIU 6. Thus the timing for all of that portion of the system, or the subsystem, is controlled by the clock signals derived from the clock board 20. Also on the clock board is logic for generating the refresh request signals as well as the refresh address signals. These refresh request and address signals are transmitted to the central interface unit 6 and to the memory unit 14. The memory unit 14 is modular in construction having a first and a second portion each with an upper and a lower sector. In the exemplary embodiment of the present invention, each of the upper and lower sectors of the memory units included eight memory board groups, each board group having four memory boards. Each of the memory boards, in turn, have a plurality of integrated circuit memory module chips thereon. In one embodiment of the present invention, the sectors are separately strobed from the central interface unit 6. The refresh request and address signals are also supplied, from the clock board 20 to the individual sectors of the memory unit 14. As will be more fully developed hereinafter, the clock board 20 is programmed by the control center 18 through an interface adaptor 22 to establish the periodicity of the refresh signals.

Similarly, the central interface unit 8 and the memory units are coupled to receive refresh request and address signals from a clock board 24. In response to those signals, the central interface unit 8 initiates the refresh cycle by generating a REFRESH-STROBE signal which is then transmitted to the control feature of the associated memory sectors. As in the case of the memory unit 14, the memory unit 16 is also in two portions, each of which has an upper and a lower sector. The clock board 24 also transmits, the refresh request and address signals, respectively, to the individual sectors of the memory unit 16. The clock board 24 is also programmed from the control center 18 by way of an interface adaptor 26.

The CIUs 6 & 8 serve, among other things, as traffic managers for the control of the operations affecting their respective subsystems. These units, in accordance with that traffic management, keep track of which elements of the associated memory unit is being operatively accessed by the CPU or the I/OU. Means are provided therein for queing the refresh-request and address signals from the clock board to issue REFRESH-STROBE signals only to one of the board groups which is not being actively accessed otherwise. Thus with eight board groups in each memory sector, while one board group is being refreshed, there are seven other board groups which are concurrently available for operational access.

It will be noticed that a first coupling path is provided from the first clock board 20 to the second clock board 24. A second similar coupling path is provided from the second clock board 24 to the first clock board 20. These coupling paths provide a means for maintaining synchronization between the two clock boards, as will be more clearly shown hereinafter.

In FIG. 3 there is shown the pertinent portions of the clock boards 20 and 24. Since they are identical in structure, only one such structure is illustrated in FIG. 3.

A free running clock 30 establishes the basic timing function for the system. In a preferred embodiment of the present invention, the output of the clock was a square wave signal having a period of 35 nanoseconds. The output of the clock is applied as input to a divide-by-two circuit 32, the output of which is a 2T signal representing two timing cycles of the clock 30. The 2T signal output from the divide-by-two circuit 32 is applied as an enable signal to the enable input of a counter 34. The counter 34 is, in the exemplary embodiment, a five-bit counter which comprises the refresh request signal generator.

As was previously mentioned, the clock board is programmed from the central controller 18. One aspect of that programming is that a predetermined five-bit digital code is applied to five corresponding input terminals 36 of the counter 34 from the central controller 18, by way of the interface adaptor 22 or 26. When the clock pulse and the 2T signal are both at a logical high and a logical high is applied to the LOAD input terminal of the counter 34, the digital code signal from the interface adaptor is loaded into the counter 34. On each 2T input pulse the counter 34 is decremented by a count of one. When the count in the counter 34 has reached zero, an output signal will be produced at the BORROW output terminal.

That borrow signal is applied as an enabling signal to a plurality of registers 36, 38 and 40. The same signal is also applied as one of the input signals to the registers 36, 38 and 40. These registers comprise the refresh request signal registers. The BORROW output signal is also applied to one input terminal of an OR gate 42. The true output of the OR gate 42 is applied to the LOAD input terminal of the counter 34. The complementary output of the OR gate 42 is applied to the DOWN input terminal of the counter 34. The status of the output of the gate 42 thus determines whether the counter 34 will load the predetermined count from the interface adaptor or will decrement on each 2T pulse.

The same borrow output signal is applied as input to the CARRY input terminals of a second counter 44. The counter 44 comprises the refresh request address counter. When the counter 44 is preconditioned, it is loaded with all zeroes. Each time the counter 34 produces a refresh request signal at the BORROW output terminal, that BORROW output signal applied to the CARRY input terminal of the counter 44 causes that counter to increment by a count of one. Again, the counter 44 is strobed and enabled, respectively, by the clock signal and the 2T signal. The counter 44 is connected as a three-bit counter with the three output bits being connected simultaneously to three corresponding input terminals of each of the request registers 36, 38 and 40. With the memory sectors being established as eight board groups, the three-bit address signal uniquely identifies a selected one of the board groups subject to the refresh operation.

Each of the three registers 36, 38 and 40 have output leads corresponding to the four input leads thereto. These four leads carry the refresh request signal and the three-bit refresh request address. The output leads from the register 36 are coupled to the input of the CIU 6 or 8 as illustrated in FIGS. 1 and 2. The registers 38 and 40, which may be considered representative of other registers, are connected to the memory units 14 or 16 directly, as also illustrated in FIG. 2. In one embodiment of the present invention, each memory sector is provided with an input refresh signal and address. In another embodiment, not illustrated, each half of the memory unit 14 is provided with a memory controller and accordingly only one set of signals is necessary for each half of the memory unit.

The application of the refresh request signal, issued from the BORROW out terminal of the counter 34 to one input terminal of the OR gate 42 causes the TRUE output terminal of the OR gate 42 to be a logical high, activating the LOAD input terminal of the counter 34. This, reloads the predetermined count from the interface adaptor into the input terminals 36 of the counter 34 to start the next cycle. As soon as the counter is loaded with the new code, the BORROW output signal disappears and the complementary output of the OR gate 42 goes to a logical high, which, when applied to the DOWN count input terminal of the counter 34, then conditions the counter to decrement with each 2T signal.

As previously mentioned, in the exemplary embodiment of the present invention, the clock signal had a period of 35 nanoseconds. Correspondingly, the 2T signal has a period of 70 nanoseconds. In the exemplary embodiment, again, a digital signal representative of a decimal 28 was loaded into the input terminals 36 of the counter 34. This arrangement, produces a refresh request signal at the BORROW output terminal of the counter 34 once every 1.96 microseconds. Since the address counter 44 is triggered by the refresh request signal, the counter 44 produces a change in output address at the same rate.

It was earlier mentioned that there is a need to synchronize the operation of the two clock boards, illustrated in FIG. 2, in order that both clock boards are refreshing in synchronism and that the two clock boards are addressing the same addresses in their respective memory units. As was mentioned, the two CIUs 6 and 8 serve, among other things, as traffic managers for the systems respectively associated therewith. Inasmuch as there is a provision for cross communication between the two CPUs 2 and 4 with respect to the CIUs 6 and 8 and their associated memories 14 and 16, it is one of the functions of the CIUs to keep track of which addresses in the memories are being refreshed to avoid conflicts with data transactions in those memory units. Because of the cross communication feature, the two CIUs must be tracking the identical refresh cycles in order to avoid confusion.

In order to accomplish the synchronization between the two clock boards, there is provided synchronization circuitry on each of the two clock boards. These synchronization circuits are cross coupled to effect the synchronization.

the synchronization circuits include, first, an eight-input AND gate 46. The refresh request counter 34 is in the form of a five-bit counter. The five output terminals of the counter 34 are connected as input to five of the eight input terminals of the AND gate 46. The address counter 44 has a three-bit output which is connected to the other three input terminals of the AND gate 46. The output of the gate 46 is connected to the J input terminals of a J-K flip-flop 48. The output of the flip-flop 48 comprises a SYNC-COUNTER-OUT signal. The output of the flip-flop 48 is also connected in feedback relation to the K input terminals of the same flip-flop. Thus, on the next 2T signal, the flip-flop 48 is reset.

The connection between the output terminals of the counter 34 and the first five input terminals of the gate 46 are so chosen between the true and complement output terminals of the counter 34 that the enabling output signal from the counter 34 represents the digital number 00010. The enabling signal from the counter 44 represents the digital number 111. These values are such that the output signal of the gate 46 is indicative that after two more 2T pulses, the counter 34 will be loaded with the predetermined count code and that the counter 44 will roll over to 0. The SYNC-COUNTER-OUT signal from the flip-flop 48 on one clock board is coupled to the SYNC-COUNTER-IN terminal on the other clock board and, conversely the SYNC-COUNTER-OUTPUT signal from the other clock board is connected to the SYNC-COUNTER-IN terminal of the illustrated board.

The SYNC-COUNTER-IN terminal is connected to the J input terminal of a flip-flop 50, the TRUE output of which is connected to one input terminal of an AND gate 52. The TRUE output terminal of the AND gate 52 is connected to a second input terminal of the OR gate 42. The TRUE output terminal of the AND gate 52 is also connected to the LOAD input terminal of the address counter 44. The complementary output terminal of the AND gate 52 is connected to the UP input terminal of the counter 44.

A second input signal for the AND gate 52 is obtained from the output of a flip-flop 54. The same TRUE output from the flip-flop 54 is applied as an input signal to the J input terminal of a further flip-flop 56. The RESET output of the flip-flop 56 is connected to one of a pair of AND-J input terminals of the flip-flop 54. The other of the pair of AND-J input terminals of the flip-flop 54 are connected to receive a signal from the interface adaptor 22 (26) indicative that the 2T clock signals are in phase. This later signal remains at a logical high so long as the 2T clock signals from the separate boards remain in phase.

The set output terminal of the flip-flop 54 is also connected to the UP input terminal of each of a first and second counter 58 and 60, respectively. The RESET output terminal of the flip-flop 54 is connected to the LOAD input terminal of each of the counters 58 and 60. Both of these counters are connected to be strobed by the clock signal and enabled by the 2T signal. The CARRY-IN terminal of the counter 58 is connected to be enabled by a V-plus signal. The BORROW-IN terminal is connected to ground in both of the counters 58 and 60. The CARRY OUTPUT terminal of the counter 58 is connected to the CARRY-IN terminal of the counter 60. In this way, the two counters are connected in cascade.

In the exemplary embodiment these two counters are, each, five-bit binary counters. The output of the cascaded pair is taken from the fourth bit of the counter 60 and connected to the K input terminals of the flip-flop 54 whereby to reset the flip-flop 54. When the flip-flop 54 is reset, the load input terminals of the counters 54 and 60 are enabled and the two counters are both reset to 0. When the flip-flop 54 is set by the coincidence of a 2T CLOCK IN-PHASE signal from the interface adaptor and a RESET signal from the flip-flop 56, the UP input terminal of the counters 58 and 60 are enabled. The counters then start counting at the 2T pulse rate and count to a count of 256, in the exemplary embodiment. This count defines a window of approximately 18 microseconds. At the end of that period the flip-flop 54 is reset.

During the interval while the flip-flop 54 is set, the AND gate 52 is enabled. Thus during the interval of the time window, measured by the counters 58 and 60, during which time the AND gate 52 is enabled, when a SYNC-COUNTER-IN signal is received from the other of the clock boards, the LOAD input of the counters 34 and 44 are activated to reset the counter 44 to all zeroes and to reset the pre-established count code into the terminals 36 of the refresh request counter 34, synchronously with the same occurrence in the correlated clock board. The SYNC-COUNTER-IN signal causes the flip-flop 50 to be set for one 2T time period. It is then reset by the feedback loop.

When the flip-flop 50 is reset, the complement output of the AND gate 52 and of the OR gate 42 is true, enabling the counter 34 to be decremented by each 2T pulse and the counter 44 to be incremented by each refresh request signal from the BORROW output terminal of the counter 34. The flip-flop 56 is set on the next 2T signal after the flip-flop 54 has been set.

When the flip-flop 56 has been set, the complementary or reset output terminal of the flip-flop 56 goes to a logical low. That logical low is applied to one of the two ANDED input terminals of the flip-flop 54 thereby disabling the flip-flop 54 from again being set. Thus the window of 256 2T cycles is a one-time operation which is triggered by a RESET signal to the flip-flop 56 from the interface adaptor, the signal being labeled RE-SYNC. Such a signal is applied from the interface adaptor at start-up condition to establish an initial synchronization of the two clock boards. A RESYNC signal will also be transmitted from the interface adaptor to reset the flip-flop 56 and again start the counting of the counters 58 and 60 if it has been detected that for some reason or another the two clock boards have fallen out of synchronization.

Accordingly, it may be seen that there has been provided an improved memory refresh control system which is independent of the configuration of the memory units or of the associated interface units, and which is suitable for use with computer systems having distributed memory characteristics.

The embodiments of the invention in which an exclusive property or privilege is claimed are defined as follows:

1. A distributed digital data processing system comprising:
    a first computer subsystem including a first control processing unit (CPU), a first central interface unit (CIU), and a first volatile random access memory unit (MU); and a second computer subsystem including a second central processing unit (CPU), a second central interface unit (CIU) and a second volatile random access memory unit (MU), each MU storing digital data signals, being divided into m sections, with each section being divided into n groups, where m and n are integers greater than one and including means for refreshing the data signals stored there.
    first means providing communications between the first CIU and the first and second CPU's, and between the first CIU and the first and second MU's,
    second means providing communications between the second CIU and the first and second CPU's, and between the second CIU and the first and second MU's,
    all communications between a CPU and an MU being controlled by and transmitted through a CIU;
    a system control center including a first clock subsystem for the first computer subsystem and a second clock subsystem for the second computer subsystem, each clock system providing timing signals, refresh request signals and refresh address signals, the refresh address signals specifying a memory group,
    third circuit means for applying the refresh request and refresh address signals of the first clock subsystem to the first CIU and first MU,
    fourth circuit means for applying the refresh request and refresh address signals of the second clock subsystem to the second CIU and the second MU,
    the first CIU in response to the receipt of a refresh request signal producing a refresh strobe ($REF) which is applied to the first MU and which causes the means for refreshing data signals to refresh data signals stored in the addressed blocks of the first MU; the second CIU in response to the receipt of a refresh request signal producing a refresh strobe ($REF) which is applied to the second MU and which causes the means for refreshing the data signals to refresh the data signals stored in the addressed blocks of the second MU; and
    means for synchronizing the issuance of the refresh request and refresh address signals by the first and second clock subsystems.

2. A distributed data processing system as defined in claim 1 in which m equals two and the third and fourth circuit means applies the refresh request and refresh address signals to both sections of each MU.

3. A distributed data processing system as defined in claim 2 in which n equals eight.

* * * * *